(12) United States Patent
Camuffo et al.

(10) Patent No.: US 8,175,554 B2
(45) Date of Patent: May 8, 2012

(54) RADIO FREQUENCY COMMUNICATION DEVICES AND METHODS

(75) Inventors: Andrea Camuffo, Munich (DE); Grigory Itkin, Munich (DE); Andreas Langer, Unterschleissheim (DE)

(73) Assignee: Intel Mobile Communications GmbH, Neubiberg (DE)

( * ) Notice: Subject to any disclaimer, the term of this patent is extended or adjusted under 35 U.S.C. 154(b) by 1036 days.

(21) Appl. No.: 12/116,576

(22) Filed: May 7, 2008

(65) Prior Publication Data

US 2009/0280755 A1    Nov. 12, 2009

(51) Int. Cl.
*H01Q 11/12* (2006.01)
*H04B 1/04* (2006.01)

(52) U.S. Cl. .................... 455/126; 455/127.2

(58) Field of Classification Search .............. 455/126, 455/127.1, 127.2, 129; 333/17.1, 17.3, 24 R, 333/109, 111
See application file for complete search history.

(56) References Cited

U.S. PATENT DOCUMENTS

| | | | | |
|---|---|---|---|---|
| 5,745,016 A | * | 4/1998 | Salminen | 333/17.1 |
| 5,956,627 A | * | 9/1999 | Goos | 455/127.1 |
| 6,020,795 A | * | 2/2000 | Kim | 333/33 |
| 2005/0170794 A1 | * | 8/2005 | Koukkari et al. | 455/120 |

\* cited by examiner

*Primary Examiner* — Nguyen Vo

(74) *Attorney, Agent, or Firm* — Eschweiler & Associates, LLC

(57) ABSTRACT

One embodiment relates to a radio frequency (RF) communication device. The RF communication device includes a coupler having a plurality of ports and an adjustable termination coupled to one of the plurality of ports. The adjustable termination is adjustable based on an operating condition of the RF communication device. Other methods and systems are also disclosed.

23 Claims, 7 Drawing Sheets

RADIO FREQUENCY COMMUNICATION DEVICES AND METHODS

The present disclosure relates generally to methods and systems related to radio frequency (RF) communication devices.

BACKGROUND

Cell phone service providers have taken numerous measures to reduce the number of dropped calls for their customers. For example, they have attempted to install more cell towers (base stations) to expand their wireless network coverage, and have increased the capacity of the individual base stations in a variety of ways. Despite these efforts, dropped calls are still one of the most commonly reported complaints for wireless service providers.

In a recent effort to reduce dropped calls, wireless service providers have requested cell phone manufacturers to deliver cell phones in accordance with total radiated power requirements. To comply with these requirements, cells phones should transmit power over the antenna at a relatively constant power (i.e., with a limited power variation). Because the transmitted power relates to the effective communication range for the cell phone, a relatively constant transmission power helps to ensure that cell phones can communicate with base stations up to at least some minimal range.

Although wireless service providers have requested manufacturers to deliver phones that meet total radiated power requirements, adequate solutions have been unavailable until now.

SUMMARY

The following presents a simplified summary in order to provide a basic understanding of one or more aspects of the disclosed systems and methods. This summary is not an extensive overview of the invention, and is neither intended to identify key or critical elements of the invention, nor to delineate the scope thereof. Rather, the primary purpose of the summary is to present some concepts in a simplified form as a prelude to the more detailed description that is presented later.

One embodiment of the disclosure relates to a radio frequency (RF) communication device. The RF communication device includes a coupler having a plurality of ports and an adjustable termination coupled to one of the plurality of ports. The adjustable termination is adjustable based on an operating condition of the RF communication device.

The following description and annexed drawings set forth in detail certain illustrative aspects and implementations of diverse embodiments. These are indicative of only a few of the various ways in which the disclosed principles may be employed.

DETAILED DESCRIPTION

Figure 1:
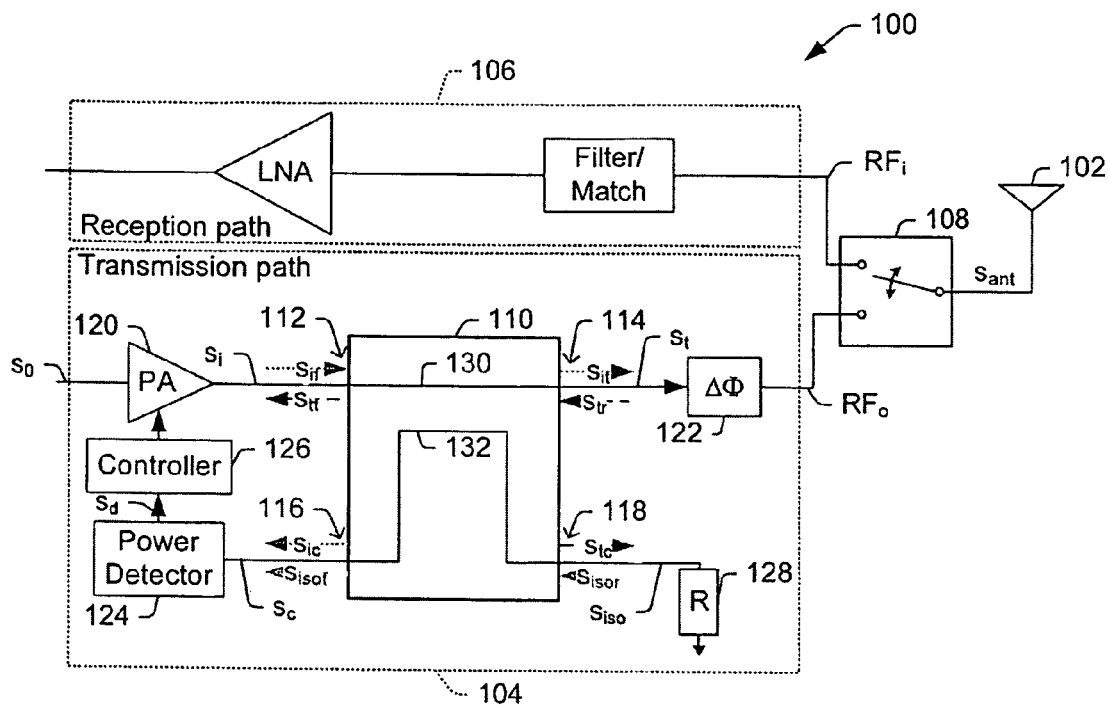
FIG. 1 shows a transceiver portion of a wireless communication device that suffers power variation at the antenna.

One or more implementations disclosed systems and methods will now be described with reference to the attached drawings, wherein like reference numerals are used to refer to like elements throughout.

As now discussed in the context of FIGS. 1-4, several reasons why some cellular phone architectures exhibit a significant power variation for signals transmitted over a cellular antenna have been appreciated. To understand one reason why this power variation arises, FIG. 1 shows a portion of wireless communication device 100, such as a GMS/EDGE cell phone, that wirelessly communicates via an antenna 102 and suffers from power variation. Note that nothing in FIGS. 1-4 or the accompanying discussion are admitted as prior art.

The wireless communication device 100 includes a transmission path 104 for generating an outgoing radio frequency signal ($RF_o$) and a reception path 106 for receiving an incoming radio frequency signal ($RF_i$). Depending on whether data is being transmitted or received, a switchplexer 108 selectively couples the transmission path 104 or the reception path 106 to the antenna 102. For purposes of clarity and simplicity, the switchplexer 108 is shown as switching between only two positions, but in more practical solutions the switchplexer 108 has other positions as well (e.g., position associated with a duplexer, positions associated with additional frequency bands, etc.).

The transmission path 104 includes a coupler 110 that includes two transmission lines 130, 132 set close enough together such that energy passing through one line (e.g., 130) is coupled to the other line (e.g., 132). Thus, an input port 112, a transmission port 114, a coupled port 116, and an isolated port 118; are respectively associated with an input signal $s_i$, a transmission signal $s_t$, a coupled signal $s_c$, and an isolated signal $s_{iso}$ as shown. Note these names are arbitrary and any port can act as the input port, which results in the horizontally adjacent port being the transmitted port, the vertically adjacent port being the coupled port, and the diagonal port being the isolated port. Because of coupling between the ports and possible reflections from loads at each port, each of the signals $s_i$, $s_t$, $s_c$, and $s_{iso}$ has multiple contributions as now described.

For example, $s_i$ includes at least two components: a forward input signal component $s_{if}$ input into the input port 112, and a signal component $s_{it}$ transmitted back from the transmission port 114. A power amplifier 120 receives a signal-of-interest, $s_0$, and generates $s_{if}$ based thereon. Part of the power of $s_{if}$ is transmitted through the coupler 110 and out the transmission port 114, thereby generating a signal component $s_{it}$. Part of power of $s_{it}$ is then delivered to the antenna 102 as $s_{ant}$, while the remainder of $s_{it}$ is reflected back towards the transmission port 114 as a reflected signal component $s_{tr}$. Part of $s_{tr}$ passes back through the coupler 110 and is transmitted back to the input port 112 as $s_{tt}$. In this manner, $s_i$ includes the two components $s_{if}$ and $s_{tt}$, where $s_{tt}$ can be thought of as the sum of different contributions caused by multiple reflections.

Another part of the $s_{tr}$ is coupled out to the isolated port 118 as signal component $s_{tc}$. Part of the power of $s_{tc}$ is reflected back from a static complex termination 128 towards the transmission port 114, thereby generating signal component $s_{isor}$ due to reflection at impedance 128.

Because $s_{isor}$ is transmitted back into the isolated port 118, part of its power will be transmitted out the coupled port 116 as signal component $S_{isot}$. Accordingly, $s_c$ at the coupled port 116 will include at least two components $s_{isot}$ that is transmitted from the isolated port 118, and $s_{ic}$ that is coupled to the input port 112. $s_{ic}$ is based largely on the component $s_{if}$ generated by the power amplifier 120.

A power detector 124 and controller 126 collectively provide feedback to the power amplifier 120 in an effort to deliver a constant power to the antenna 102. More specifically, the power detector 124 provides a detector signal, $s_d$, to the controller 126, where $s_d$ has a magnitude that is proportional to the magnitude of $s_c$. In an attempt to keep a constant power delivered to the antenna 102, the controller 126 adjusts the power amplifier 120 to keep $s_d$ constant. However, because the power detector 124 bases its detector signal $s_d$ on the superposition of components at the coupled port 116 (e.g., $s_{isot}$, $s_{ic}$), the controller 126 is unable to account for the load phase independence of these different components. Despite the best efforts of the controller 126, this can lead to power variation at the antenna 102, absent countermeasures. For example, if a user touches the antenna, the load phase (phase of the reflection coefficient) of the antenna will change, which will affect the phase and/or amplitude of the signal components independently.

Figure 2:
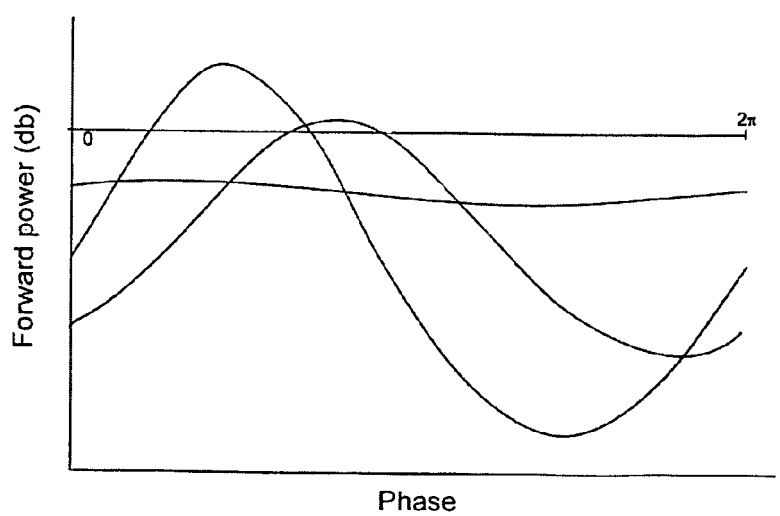
FIG. 2 shows a chart of the load phase of an antenna versus power variation for three different complex terminations.

One way of accounting for the load phase independence of the different components is to provide a static complex termination 128 at the isolated port 128. By choosing a proper value for the static complex termination 128, the wireless device 100 can influence the phase and amplitude of signal component $s_{isot}$. Thus, a properly selected complex termination generates an "artificial" load phase ripple that compensates for load phase ripple between the switchplexer 108 and antenna 102 and that compensates ripple caused by finite directivity of coupler. As a result the complex termination provides an output power that is nearly independent of load phase of the antenna 102. This is shown in FIG. 2, which shows an example of the load phase of the antenna vs. power variation for three different complex terminations for a given transmission frequency. The first curve relates to a first complex termination that results in a relatively large power variation delivered to the antenna over load phase of the antenna. The third curve shows a properly selected complex termination that results in an approximately constant power over the load phase of the antenna.

Figure 3:
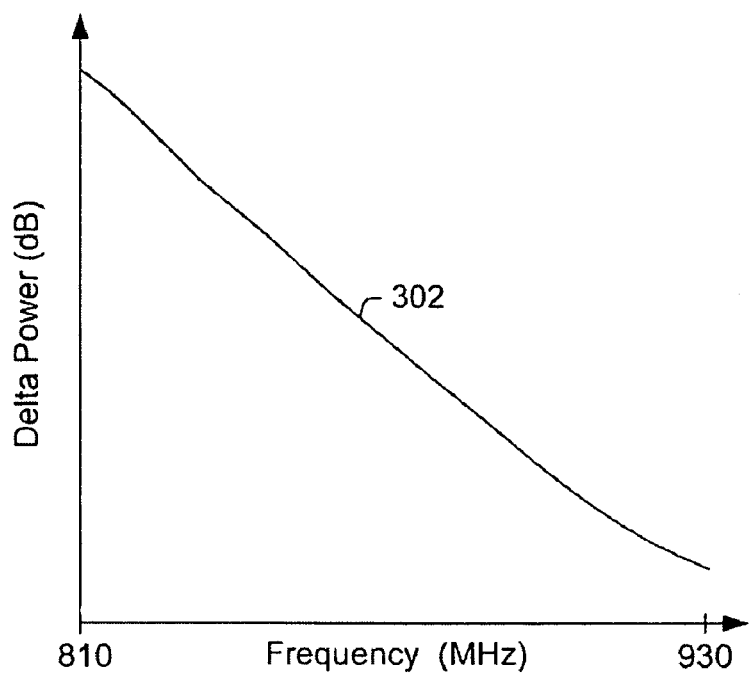
FIG. 3 shows a chart of power variation versus frequency in the low GSM band for the wireless communication device of FIG. 1.
Figure 4:
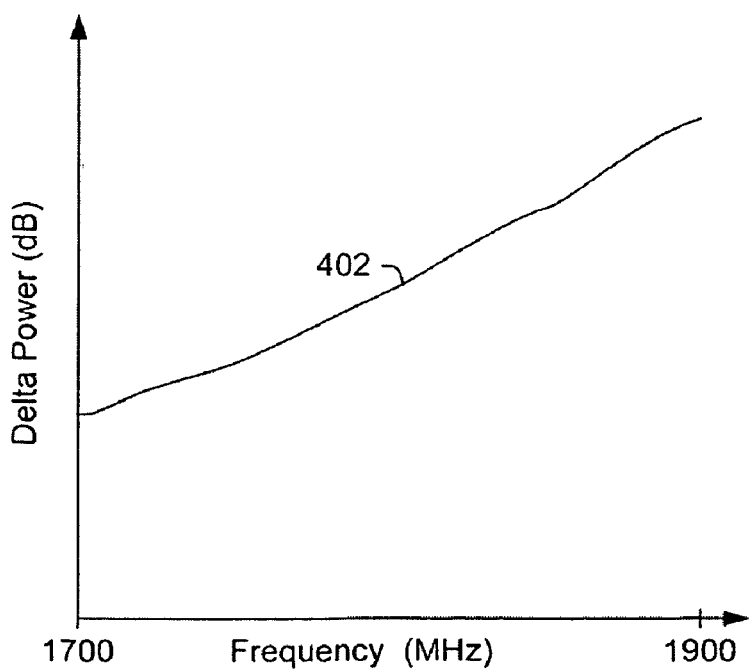
FIG. 4 shows a chart of power variation versus frequency for the high GSM band for the wireless communication device of FIG. 1.

However, even though a properly selected static complex termination can limit power variation over load phase of the antenna at a given frequency, it alone is unable to account for variations in frequency and/or other dynamic operating conditions. For example, FIGS. 3-4 show some examples of where a static complex termination is used, but where power variation is still experienced for transmission over different frequency bands. More particularly, FIG. 3 shows transmission over the low GSM band (i.e., approximately 850 MHz band, where 824.2-848.8 MHz is used for transmission and 869.2-893.8 MHz is used for reception.) The curve 302 shows a larger power variation at lower frequencies and smaller power variation at higher frequencies. FIG. 4 shows an example for transmission over the high GSM band (i.e., approximately 1800 MHz band, where 1710.2-1784.8 MHz is used for transmission and 1805.2-1879.8 MHz is used for reception). The curve 402 shows a large power variation, particularly for high frequencies. This power variation may ultimately lead to less power being delivered to the antenna then desired, resulting in dropped calls and other unreliable performance, absent countermeasures.

In response to these and other shortcomings in wireless devices, wireless devices and methods may include an adjustable complex termination that limits power variation as a function of an operating condition of the wireless device. Some illustrative operating conditions include, but are not limited to: transmission frequency, different transmission paths, temperature, and user interaction with the phone (e.g., for flip-phones or slider phones, whether the phone is open or closed).

Figure 5:
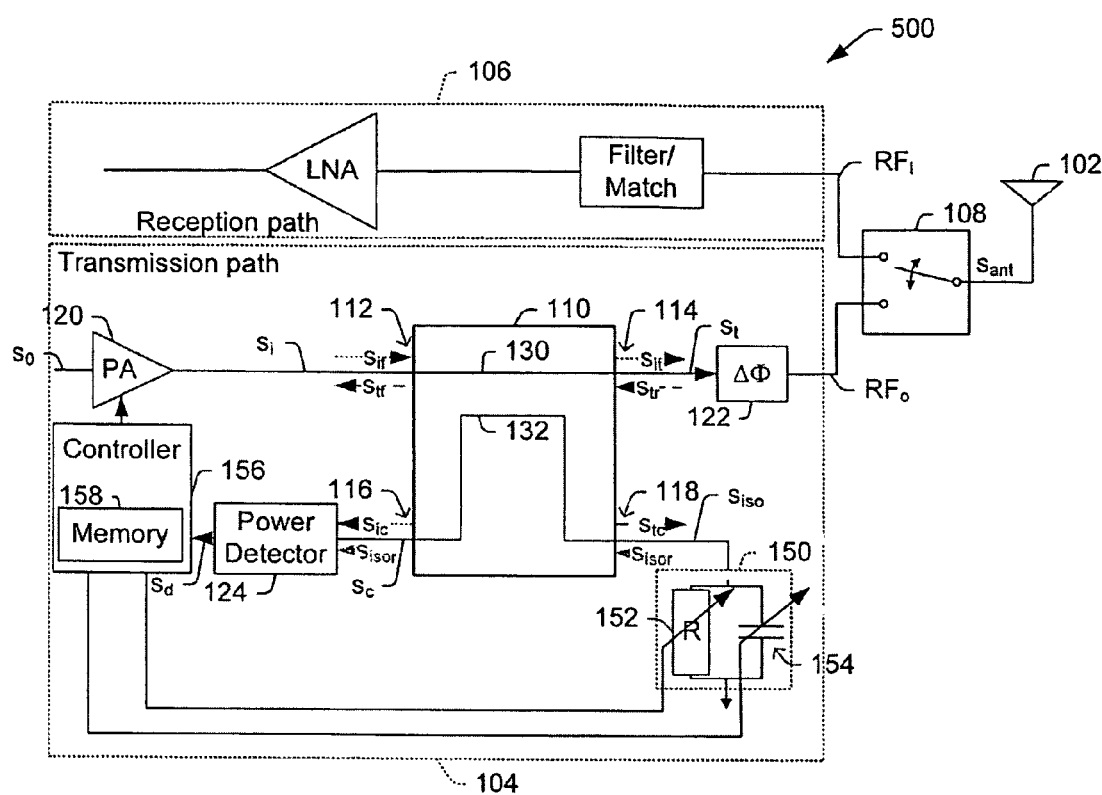
FIG. 5 shows a transceiver portion of a wireless communication device that remedies the shortcomings of FIG. 1's communication device.

Turning now to FIG. 5, one embodiment of a wireless device is depicted. In particular, in FIG. 5's embodiment at least one port of the coupler 110 is coupled to an adjustable termination 150 that can be tuned to account for different operating conditions of the wireless device 500. In the illustrated embodiment, the adjustable termination 150 is a complex termination that includes an adjustable resistor (R) 152 in series with and an adjustable capacitor (C) 154.

Prior to transmission, the controller 156 can pre-determine R/C values that are most suitable for each transmission frequency. In one embodiment, these pre-determined R/C values can be determined statically by using pre-calculated values, while in another embodiment these pre-determined R/C values can be determined dynamically by using calibration measurements. In either event, these pre-determined values are stored in the memory unit 158.

Just before transmission at a particular transmission frequency, the controller 156 can set the adjustable termination 150 to the most suitable R/C value for that transmission frequency. Then, during transmission, the controller 156 can provide control signals to the power amplifier 120 that scale the signal $s_{if}$ depending on load phase of the antenna 102. The control signals can be based on feedback from the power detector 124 and may also be based on the transmission frequency.

Because adjustable termination 150 changes the phase and or amplitude of the component $s_{isot}$, this wireless device 500 can exhibit power variations between the switchplexer 108 and antenna 102 that are much lower than previously achievable. For example, in one embodiment the transmission power delivered to the antenna 102 varies no more than approximately ±0.5 dB over load phase of the antenna for any transmit frequency dB, although this could be higher or lower depending on design constraints.

Although the illustrated embodiment shows an adjustable termination 150 at the isolated port 118, adjustable termination(s) could also be coupled to other ports in other embodiments. For example, in one embodiment, the transmission port 114 could be coupled to an adjustable termination that comprises a phase shifter 122 that is adjustable, such as a tunable transmission line. This embodiment, however, has a potential disadvantage in that can be difficult to implement in an integrated circuit.

Figure 6:
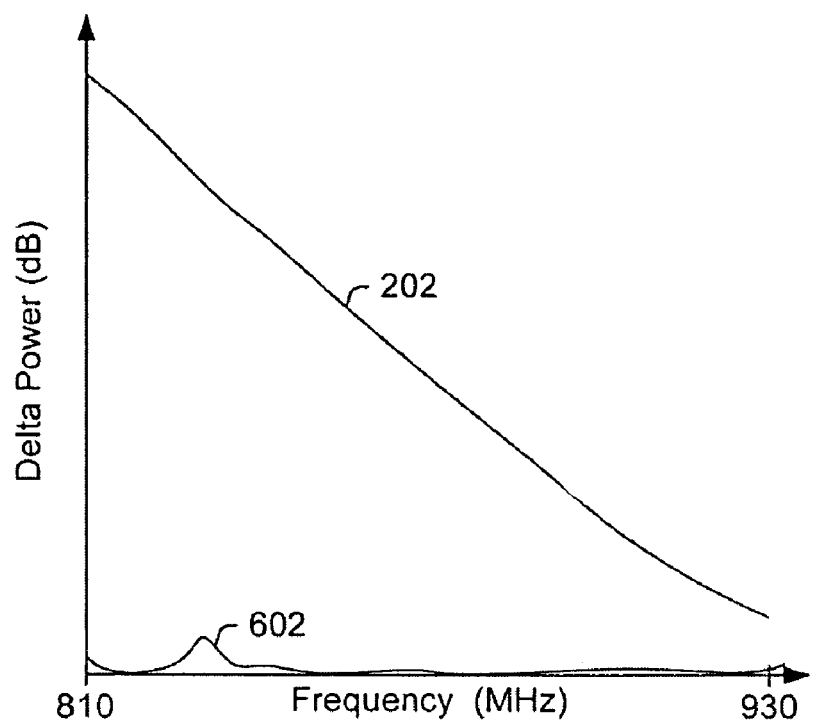
FIG. 6 shows a chart of power variation versus frequency in the low GSM band for the wireless communication device of FIG. 4.
Figure 7:
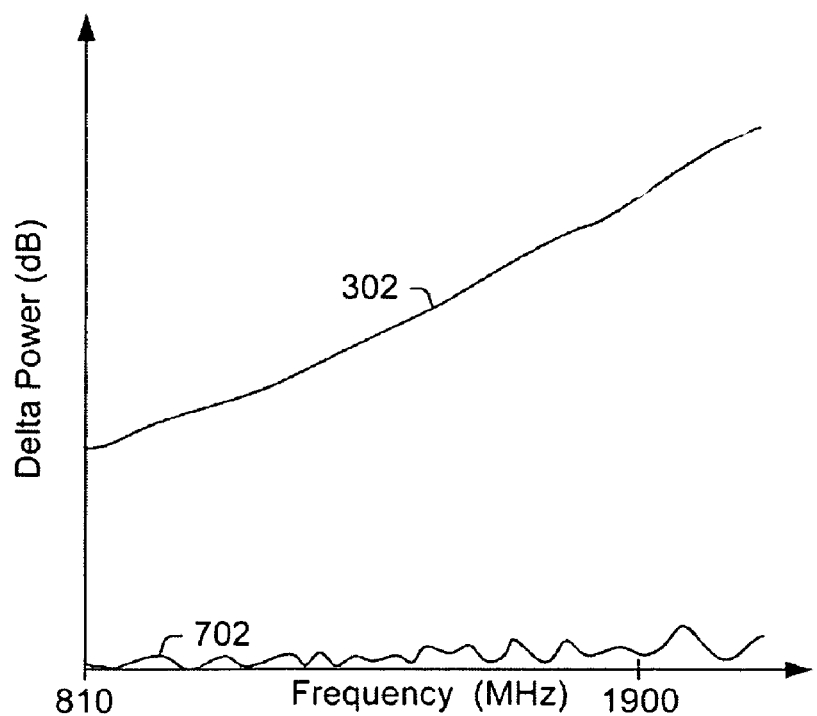
FIG. 7 shows a chart of power variation versus frequency for the high GSM band for the wireless communication device of FIG. 4.

FIGS. 6 and 7 illustrate how the wireless device 500 can limit power variation as a function of frequency compared to the previously discussed cell phone architecture 100. In FIG. 6, a curve 602 illustrates the power variation at the antenna 102 for the wireless device 500 transmitting over the low GSM frequency band. Because the adjustable termination 150 can be adjusted to a different value for each transmission frequency, the curve 602 shows much lower power variation than the previously discussed curve 202. In FIG. 7, another curve 702 illustrates the power variation at the antenna 102 for the wireless device 500 transmitting over the high GSM frequency band. The 702 curve also shows much lower power variation than the previously discussed curve 302.

As mentioned, the pre-determined R/C values can be determined in several ways depending on the implementation. In one embodiment, the predetermined R/C values can be calculated based on an S-parameter of the switchplexer 108. In other embodiments, the pre-determined R/C values can be calculated based on a magnitude of a directivity coefficient for the coupler as a function of frequency, $|D(f)|$; and the phase of the directivity coefficient for the coupler as a function of frequency, $\phi(f)$.

Figure 8:
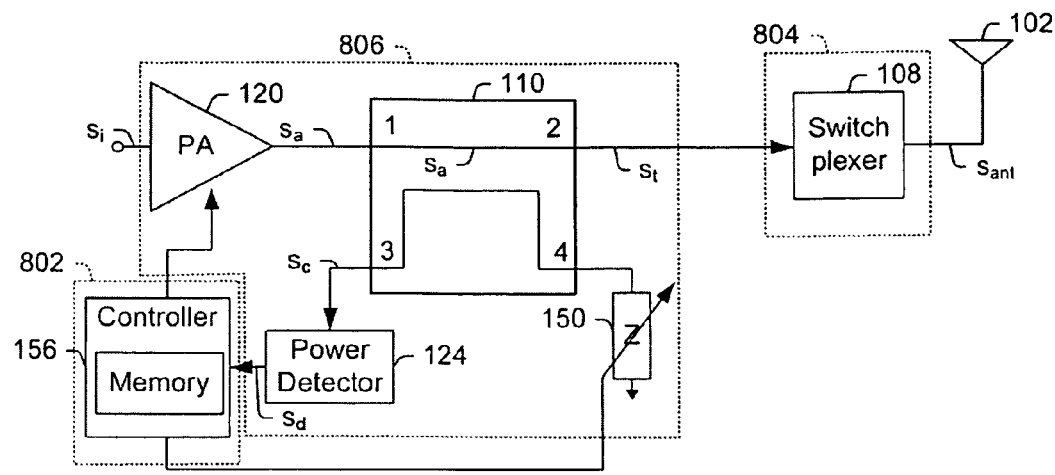
FIGS. 8-9 show various levels of integration for the wireless communication device.
Figure 9:
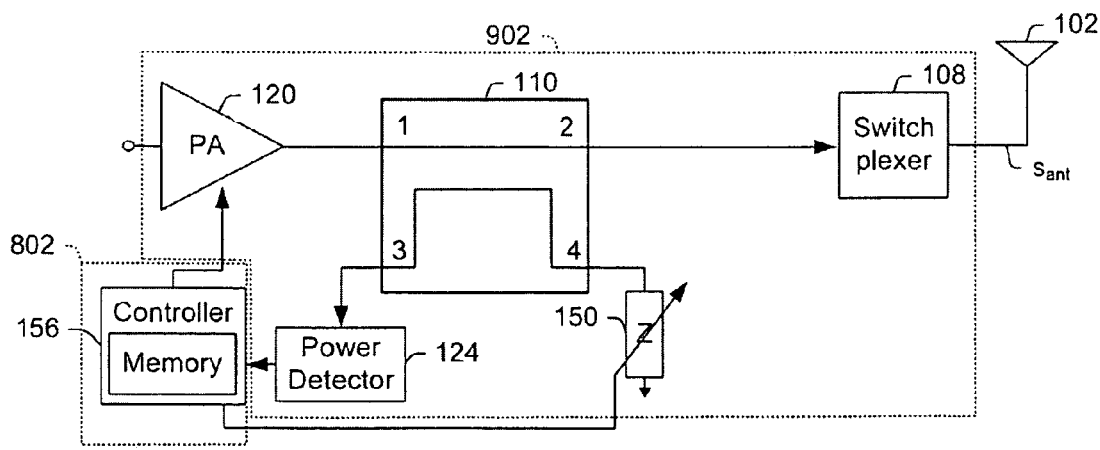

Referring now to FIGS. 8-9, one can see that the transmission path 104 may be manufactured with varying levels of integration. FIG. 8, for example, shows an embodiment where the controller 156 is formed on a first integrated circuit (IC) 802 and the switchplexer 108 is formed on a second IC 804. A power amplifier IC 806 includes the coupler 110, power amplifier 120, power detector 124, and adjustable termination 150.

In FIG. 8, the power amplifier IC 806 could have several different interfaces. In one embodiment, the power amplification IC has a parallel interface where each control signal has its own pin. Therefore, each power amplifier control signal would have its own pin (e.g., PA enable, band select, mode select, etc.), and each control signal for the adjustable termination 150 would also have its own pin. However, because it is advantageous to reduce the number of pins for each integrated circuit (the number of pins strongly affects the size and cost of a given integrated circuit), in other embodiments it may be useful to include a serial interface with a set of registers at the interface of the power amplifier IC 806. In this way, the desired states can be encoded and transmitted to the power amplifier IC 806 using datagrams. For example, the controller 156 could transmit a datagram that specifies a particular adjustable termination setting to the power amplifier IC 806, which is registered and used until another adjustable termination setting is provided. Because transmission frequencies may be used for relatively long time periods, the datagrams provide a good balance between cost and performance.

FIG. 9 shows another embodiment where the switchplexer 108 is integrated into the power amplifier IC 902. Although the power amplifier 120 and switchplexer 108 are found on a single IC in many of today's GSM/EDGE applications, in multimode applications it sometimes is desirable to keep these blocks on separate ICs. Other variations on levels of integration could also be used.

Figure 10:
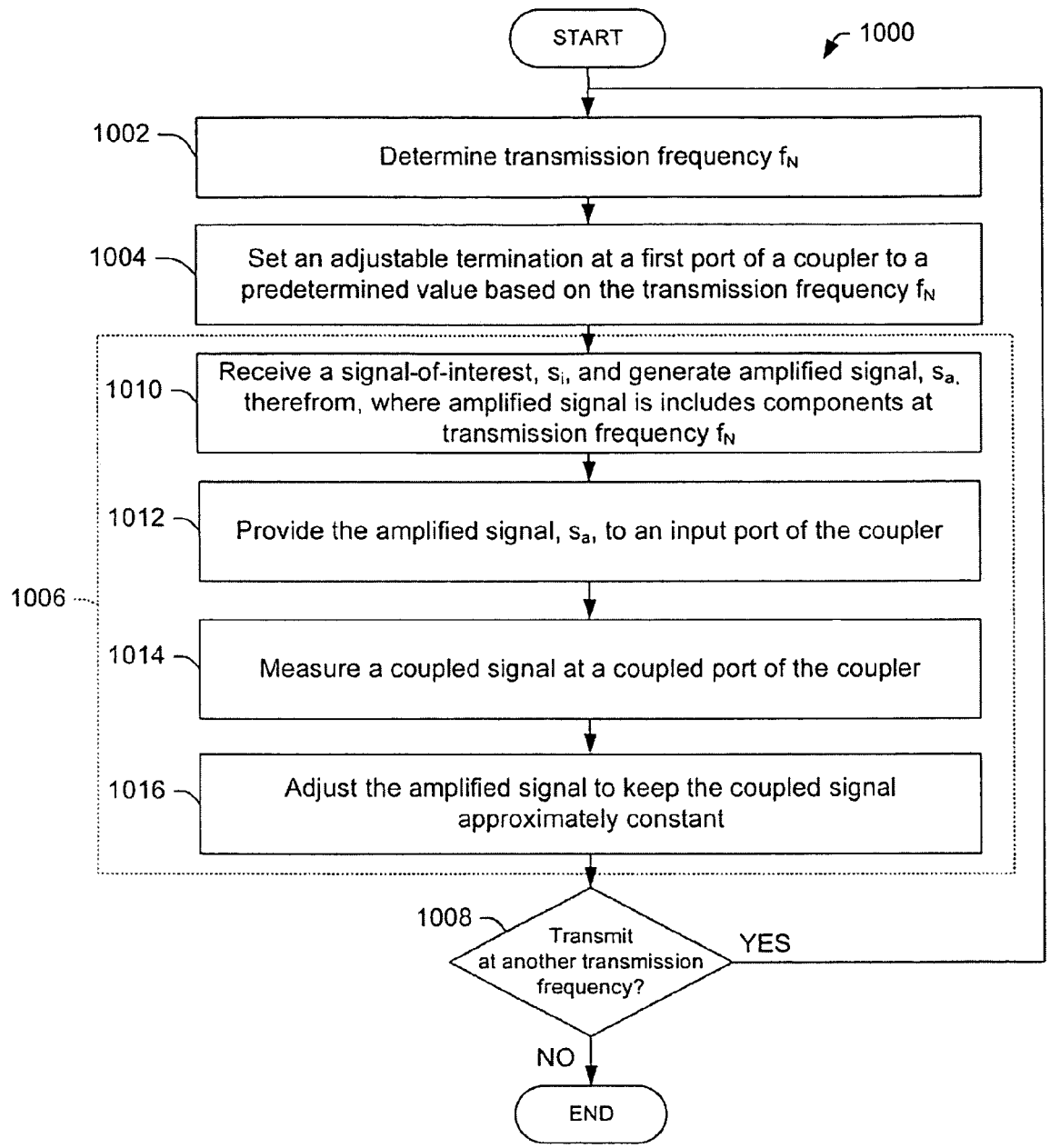
FIG. 10 shows an embodiment of a transmission method.

Now that some examples of have been discussed, reference is made to FIG. 10, which shows a transmission method embodiment 1000. Although the embodiment is discussed in the context of an operating condition that is a transmission frequency, the present disclosure may also be applicable to account for other operating conditions such as temperature and user interaction with the phone (e.g., for flip-phones or slider phones, whether the phone is open or closed), among other conditions. While this method is illustrated and described below as a series of acts or events, the transmission method is not limited by the illustrated ordering of such acts or events. For example, some acts may occur in different orders and/or concurrently with other acts or events apart from those illustrated and/or described herein. In addition, not all illustrated acts may be required to implement an according methodology. Further, one or more of the acts depicted herein may be carried out in one or more separate acts or phases.

Referring now to FIG. 10, the method 1000 starts at 1002 when the transmission frequency $f_N$ is determined, where N is the number of transmission channels.

At 1004, an adjustable termination at a first port of a coupler is set to a predetermined value based on the transmission frequency. If a designer wanted very low power variation regardless of cost, each transmission frequency could correspond to a different termination. However, if a designer wanted to reduce costs, some transmission frequencies could share a common termination for some transmit channels. This is possible since the antenna load conditions do not significantly change over a couple of channels. As one of ordinary skill in the art will appreciate, all such variations are contemplated as falling within the scope of the present disclosure.

At 1006, an outgoing RF signal is transmitted over the antenna at the transmission frequency $f_N$. After transmission, a determination is made at 908 whether transmission at another transmission frequency is desired. If so ("Yes" at 1008), the method returns to 1002 and another frequency is selected. Then in 1004, another adjustable termination can be selected in 1004 to correspond to the new frequency, and so on.

As shown, transmitting the outgoing RF signal (1006) includes several sub-blocks. In 1010, a signal-of-interest, $s_O$, is received and an amplified signal is generated therefrom. Depending on the implementation, the amplified signal, $s_a$, could be a carrier wave or a modulated wave that is based on the signal of interest.

At 1012, the amplified signal, $s_a$, is provided to the input port of the coupler.

At 1014, a coupled signal, $s_c$, is measured at the coupled port of the coupler. The coupled signal, $s_c$, has a magnitude that is less than that of the amplified signal, $s_a$; and includes several signal components. One of these signal components $s_{if}$ is the amplified signal, while another signal component $s_{isot}$ has an amplitude and phase that is a function of the adjustable termination.

At 1016, the amplified signal, $s_a$ is adjusted to keep the coupled signal, $s_c$, approximately constant. Because the adjustable complex termination has been selected to account for the transmission frequency, the controller can now fine tune the amplified signal to limit power variation over load phase of the antenna. Therefore, the method 1000 can cooperatively adjust the amplified signal, $s_a$, and the adjustable termination to provide an approximately constant power at the antenna. In this way, power is transmitted to the antenna more efficiently than previously achievable.

Figure 11:
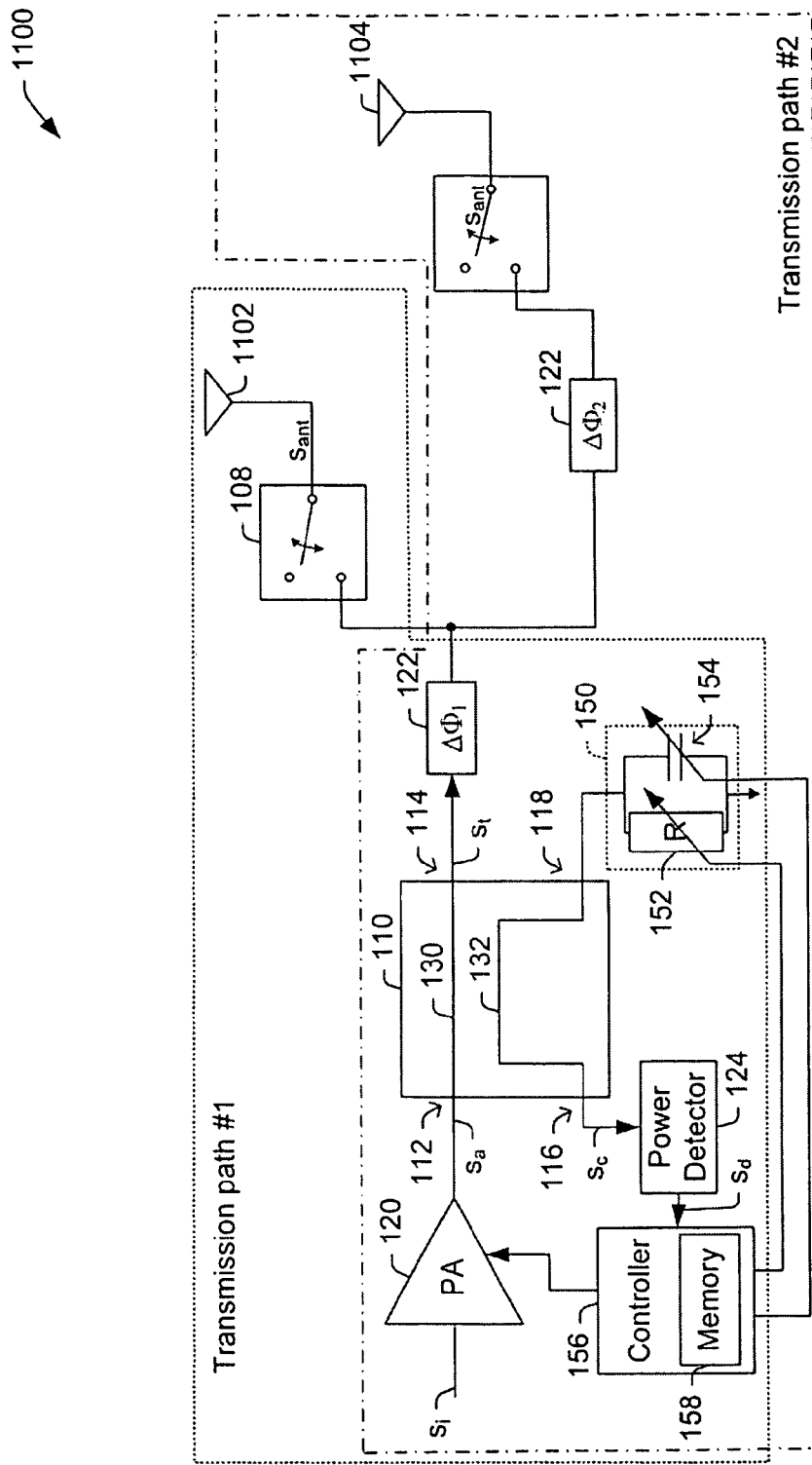
FIG. 11 shows another embodiment a wireless communication device that includes multiple communication paths.

Referring now to FIG. 11, an embodiment of a wireless device 1100 in a diversity architecture is shown. As a person of ordinary skill will appreciate, diversity architectures are useful for improving the reliability of a message signal by utilizing two or more communication paths with different characteristics. Diversity is based on the fact that different communication paths experience different levels of fading and interference. In this example, two transmitter antennas 1102, 1104 can be respectively associated with two transmission paths. Because both antennas have different characteristics and different paths from the power amplifier, different complex terminations could be used for each antenna to reduce power variation over load phase of the antennas. In other examples, more than two transmission paths could also be used.

In addition, the use of an adjustable complex termination may be used with multi-mode power amplifiers (e.g., GMSK, 8PSK, and WCDMA). For these multi-mode power amplifiers, the path from the power amplifier output to the antenna depends on the mode. For example, the path for GSMK and WCDMA would differ due to duplexer. The adjustable complex termination could be adjusted based on which path is in use.

As one of ordinary skill in the art will appreciate, some aspects of the present disclosure are useful in that they allow the front end of a wireless communication device to flexibly account for different operating conditions and different antenna conditions. Therefore, by providing a suitable array of complex terminations that compensate for the load phase of any antenna, this disclosure allows the front end manufacturer to deliver chip sets that are compatible with virtually any antenna. This allows another manufacturer that assembles a final communication device to select virtually any antenna from the market with reduced integration effort compared to existing solutions.

Although the disclosure has been illustrated and described with respect to one or more implementations, alterations and/or modifications may be made to the illustrated examples without departing from the spirit and scope of the appended claims. For example, although some embodiments describe a wireless communication device as a cellular phone, in other embodiments the wireless communication device could be another type of communication device, including but not limited to: a personal digital assistant, a pager, a walkie-talkie, a music device, a laptop, etc.

Some methods and corresponding features of the present disclosure can be performed by hardware modules, software routines, or a combination of hardware and software. To the extent that software is employed, for example by a baseband processor or other processor associated with the radio system, the software may be provided via a "computer readable medium", which includes any medium that participates in providing instructions to the processor. Such a computer readable medium may take numerous forms, including but not limited to, non-volatile media, volatile media, and transmission media. Non-volatile media includes, for example, optical disks (such as CDs, DVDs, etc.) or magnetic disks (such as floppy disks, tapes, etc.). Volatile media includes dynamic memory, such as ferroelectric memory, SRAM, or DRAM. Transmission media includes coaxial cables, copper wire, fiber optics, etc. that could deliver the instructions over a network or between communication devices. Transmission media can also include electromagnetic waves, such as a voltage wave, light wave, or radio wave.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A radio frequency (RF) communication device to transmit or receive data over a plurality of frequencies, comprising:
    a coupler having a plurality of ports; and
    an adjustable termination coupled to a first of the plurality of ports;
    a memory configured to store a plurality of pre-determined termination values corresponding to the plurality of communication frequencies, respectively, and
    a controller configured to determine a communication frequency to be used after the pre-determined termination values are stored in memory, and further configured to look-up a pre-determined termination value corresponding to the communication frequency to be used, wherein the controller is further configured to provide a first control signal to adjust an impedance of the adjustable termination based on the looked-up pre-determined termination value.

2. The RF communication device of claim 1, wherein the communication frequency comprises a transmission frequency at which the communication device transmits data over an antenna.

3. The RF communication device of claim 2, further comprising:
    a power amplifier associated with an input port of the coupler; and
    a switchplexer associated with a transmission port of the coupler and adapted to selectively couple the transmission port to the antenna.

4. The RF communication device of claim 3, where the first port to which the adjustable termination is coupled is an isolation port of the coupler.

5. The RF communication device of claim 3, further comprising:
    a power detector associated with a coupled port of the coupler.

6. The RF communication device of claim 5,
    wherein the controller is adapted to provide a second control signal to the power amplifier based on feedback from the power detector.

7. The RF communication device of claim 1, wherein the adjustable termination further comprises:
    an adjustable capacitor that is adjustable based on the communication frequency.

8. The RF communication device of claim 7, further comprising:
    an adjustable resistor in series with the adjustable capacitor and adjustable based on the communication frequency.

9. The RF communication device of claim 1, where the adjustable termination comprises: an adjustable transmission line that is adjustable based on the communication frequency.

10. A radio frequency (RF) communication device, comprising:
    a power amplifier adapted to receive a signal-of-interest and deliver an amplified signal based on the signal-of-interest;
    a coupler comprising: an input port adapted to receive the amplified signal, a transmission port adapted to provide a transmitted signal based on the amplified signal, and an isolated port associated with an adjustable complex termination;
    a memory configured to store a plurality of pre-determined termination values corresponding to a plurality of operating conditions, respectively, and
    a controller configured to determine an operating condition of the RF communication device after the pre-determined termination values are stored in memory, wherein the operating condition corresponds to at least one of: the transmission frequency, a transmission path to be used, a temperature, or a state of user interaction with the phone;

wherein the controller is further configured to lookup a pre-determined termination value from the memory based on the operating condition and provide a control signal to adjust an impedance of the adjustable complex termination based on the looked-up pre-determined termination value.

11. The RF communication device of claim 10, further comprising:

a switchplexer adapted to selectively pass the transmitted signal to an antenna associated with the communication device.

12. The RF communication device of claim 11, wherein the adjustable termination is adjustable to account for different paths between the power amplifier and the antenna.

13. The RF communication device of claim 10, where the controller is further adapted to monitor power at a coupled port of the coupler and provide feedback to the power amplifier to adjust the amplified signal.

14. The RF communication device of claim 10, wherein the power amplifier is associated with a plurality of pins and a different control signal associated with the power amplifier is transmitted over each pin.

15. The RF communication device of claim 10, wherein the power amplifier includes a set of registers associated with a serial interface.

16. The RF communication device of claim 15, wherein the power amplifier is adapted to receive control signals over the serial interface as datagrams, wherein the datagrams include a bit field associated with pre-determined R/C values for the adjustable termination.

17. A method for efficiently transmitting power to an antenna, comprising:

determining a first transmission frequency;

setting an adjustable termination at a first port of a coupler to a first predetermined value based on the transmission frequency;

transmitting a first outgoing radio-frequency (RF) signal over an antenna at the first transmission frequency while the adjustable termination is set to the first predetermined value;

determining a second, different transmission frequency;

setting the adjustable termination to a second, different predetermined value based on the second transmission frequency; and transmitting a second outgoing radio-frequency (RF) signal over the antenna at the second transmission frequency while the adjustable termination is set to the second predetermined value.

18. The method of claim 17, where transmitting the first outgoing RF signal comprises:

receiving a signal-of-interest and generating an amplified signal therefrom, where the amplified signal includes components at the first transmission frequency;

providing the amplified signal to an input port of the coupler; and adjusting the amplified signal while the adjustable termination is set to the first predetermined value to efficiently transmit power to the antenna.

19. The method of claim 18, where transmitting the first outgoing RF signal further comprises:

measuring a coupled signal at a coupled port of the coupler;

adjusting the amplified signal to keep the coupled signal approximately constant; and altering a termination at another port of the coupler based on an operating condition to efficiently transmit power to the antenna.

20. A method for efficiently transmitting power to an antenna, comprising:

receiving a signal of interest and generating an amplified signal therefrom, where the amplified signal includes components at a transmission frequency;

cooperatively adjusting the amplified signal and an adjustable termination at a port of a coupler based on the transmission frequency;

transmitting an outgoing radio-frequency (RF) signal over an antenna at the transmission frequency;

determining another transmission frequency; and cooperatively adjusting the amplified signal and the adjustable termination based on the another transmission frequency.

21. The method of claim 20, where the signal of interest comprises a baseband signal and the amplified signal comprises a modulated signal based on the baseband signal.

22. A radio frequency (RF) communication device, comprising:

a power amplifier including a set of registers associated with a serial interface and adapted to receive a signal-of-interest and deliver an amplified signal based on the signal-of-interest;

a coupler comprising: an input port adapted to receive the amplified signal, a transmission port adapted to provide a transmitted signal based on the amplified signal, and an isolated port associated with an adjustable complex termination that is adjustable based on an operating condition of the RF communication device;

wherein the power amplifier is adapted to receive control signals over the serial interface as datagrams, wherein the datagrams include a bit field associated with pre-determined R/C values for the adjustable termination.

23. A radio frequency (RF) communication device, comprising:

a coupler comprising first and second transmission lines and having a plurality of ports coupled to respective ends of the first and second transmission lines; and an adjustable termination coupled to a first of the plurality of ports and adjustable based on a dynamic operating condition of the RF communication device, wherein the first port is coupled to an end of the first transmission line;

an adjustable phase shifter coupled to a second of the plurality of ports, wherein the second port is coupled to an end of the second transmission line.

* * * * *